(12) United States Patent
Shimizu et al.

(10) Patent No.: US 9,276,067 B2
(45) Date of Patent: Mar. 1, 2016

(54) SIC SEMICONDUCTOR DEVICE AND MANUFACTURING METHOD THEREOF

(71) Applicant: Nat'l Inst. of Advanced Industrial Sci. and Tech., Chiyoda-ku (JP)

(72) Inventors: Tatsuo Shimizu, Tsukuba (JP); Tetsuo Hatakeyama, Tsukuba (JP)

(73) Assignee: National Institute of Advanced Industrial Science and Technology, Chiyoda-ku (JP)

(*) Notice: Subject to any disclaimer, the term of this patent is extended or adjusted under 35 U.S.C. 154(b) by 0 days.

(21) Appl. No.: 13/784,064

(22) Filed: Mar. 4, 2013

(65) Prior Publication Data

US 2013/0234161 A1 Sep. 12, 2013

(30) Foreign Application Priority Data

Mar. 7, 2012 (JP) .................... 2012-050477

(51) Int. Cl.
| | |
|---|---|
| H01L 29/15 | (2006.01) |
| H01L 31/0312 | (2006.01) |
| H01L 29/16 | (2006.01) |
| H01L 29/66 | (2006.01) |
| H01L 29/739 | (2006.01) |
| H01L 29/78 | (2006.01) |
| H01L 21/265 | (2006.01) |

(52) U.S. Cl.
CPC ...... *H01L 29/1608* (2013.01); *H01L 21/26506* (2013.01); *H01L 29/66068* (2013.01); *H01L 29/7395* (2013.01); *H01L 29/7802* (2013.01); *H01L 29/7813* (2013.01)

(58) Field of Classification Search
CPC .............. H01L 21/02664; H01L 29/1608; H01L 29/66068
USPC .............................................. 257/77
See application file for complete search history.

(56) References Cited

U.S. PATENT DOCUMENTS

| | | | |
|---|---|---|---|
| 6,297,100 B1* | 10/2001 | Kumar | H01L 21/0445 |
| | | | 257/E21.054 |
| 2003/0107041 A1* | 6/2003 | Tanimoto et al. | 257/77 |
| 2009/0039358 A1* | 2/2009 | Tsuchida et al. | 257/77 |

OTHER PUBLICATIONS

Philip G. Neudeck, "Silicon Carbide Technology", 2006, CRC Press, Table 5.1 on p. 5-4.*
H. Nagasawa, et al., "Challenges for Improving the Crystal Quality of 3C-SiC Verified with MOSFET Performance", Materials Science Forum vols. 600-603, 2009, pp. 89-94.
T. Kimoto, et al., "Depth Profile and Dose Dependency of Deep Levels in Ion-implanted 4H-SiC" 30p-F-11, Kyoto University, 2009, one page.

(Continued)

*Primary Examiner* — Meiya Li
*Assistant Examiner* — Peter M Albrecht
(74) *Attorney, Agent, or Firm* — Oblon, McClelland, Maier & Neustadt, L.L.P.

(57) ABSTRACT

An SiC semiconductor device having a p-type 4H—SiC region formed on a part of a surface portion of an SiC substrate, a defect reduction layer formed in a surface portion of the 4H—SiC region, the defect reduction layer having C defect density $<10^{15}$ cm$^{-3}$ by introduction of carbon, a thickness of the defect reduction layer being equal to or less than 5 nm from a surface of the SiC substrate, a gate insulating film formed on the defect reduction layer, and a gate electrode formed on the gate insulating film.

17 Claims, 7 Drawing Sheets

(56) References Cited

OTHER PUBLICATIONS

D. Okamoto, et al., "Systematic Investigation of Interface Properties in 4H-SiC MOS Structures Prepared by Over-Oxidation of Ion-Implanted Substrates", Materials Science Forum vols. 645-648, 2010, pp. 495-498.

U.S. Appl. No. 13/795,316, filed Mar. 12, 2013, Shimizu, et al.

* cited by examiner

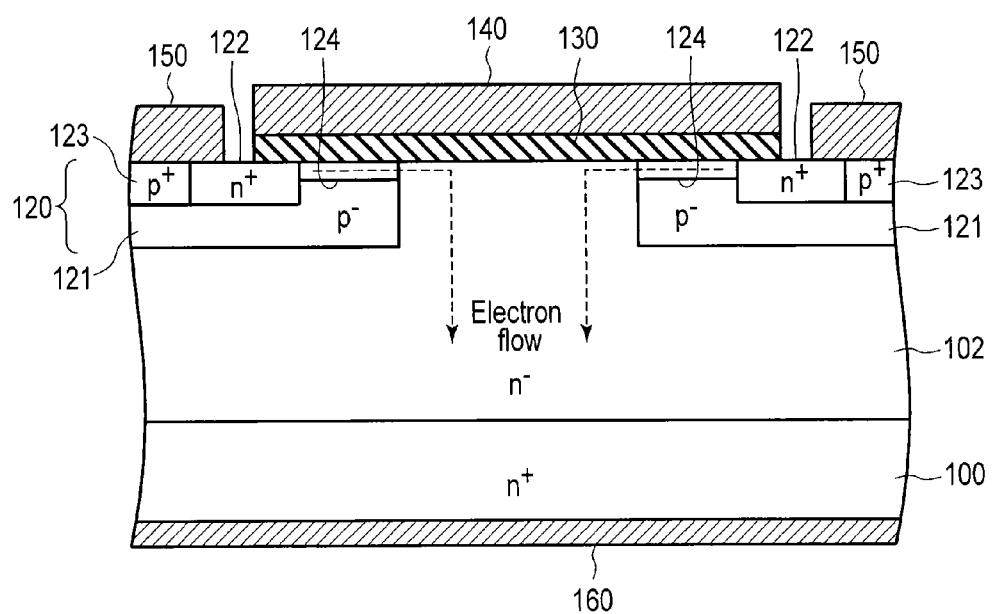
F I G. 3

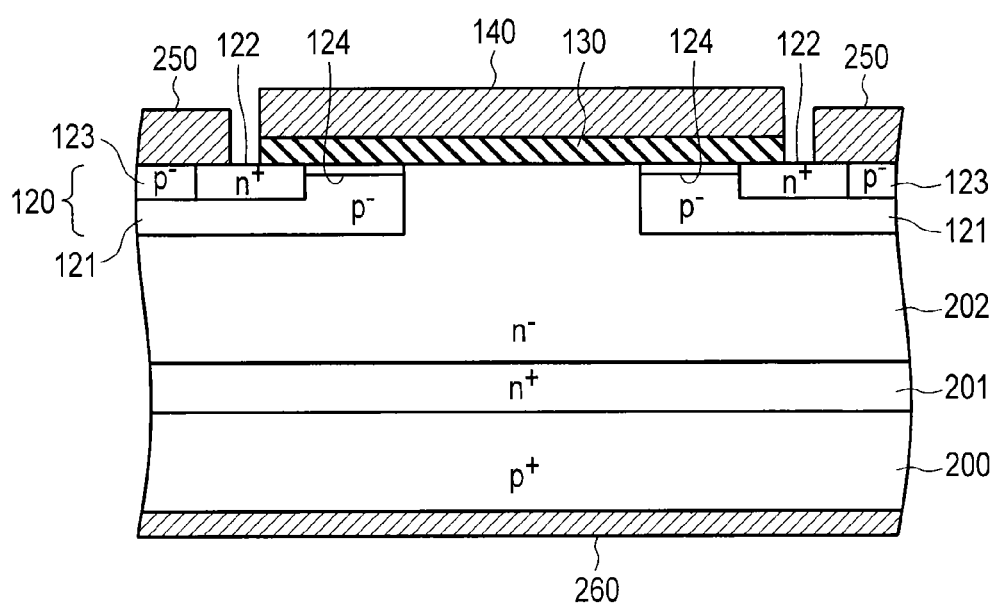
F I G. 6

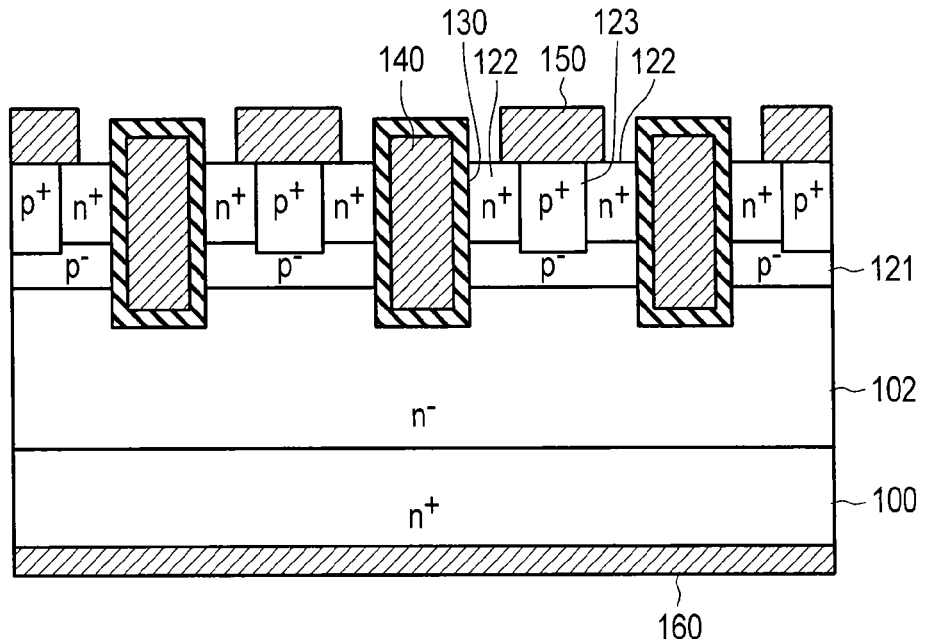
F I G. 7
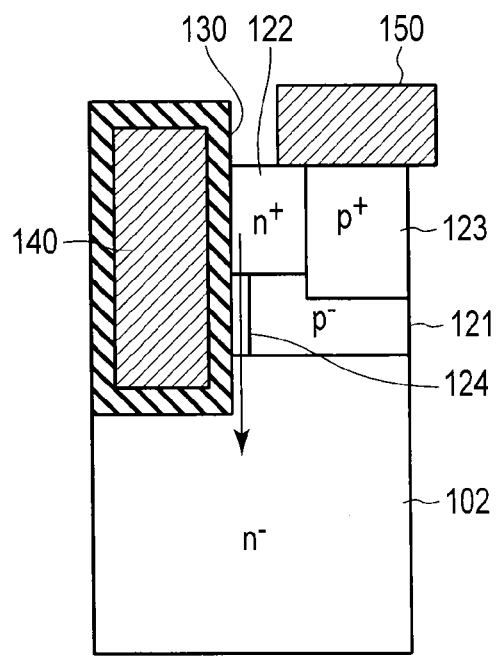
F I G. 8

SIC SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2012-050477, filed Mar. 7, 2012, the entire contents of which are incorporated herein by reference.

FIELD

Embodiments described herein relate generally to an SiC semiconductor device having a MOS structure formed by use of an SiC compound semiconductor and a manufacturing method thereof.

BACKGROUND

Conventionally, when forming an SiC substrate/SiO$_2$ insulating film interface of a MOSFET using SiC, an SiO$_2$ insulating film is formed by subjecting the surface of the SiC substrate to hydrogen termination and then oxidizing the surface or forming an insulating film by deposition. At this time, since the hydrogen termination of the SiC substrate surface is easily removed and oxygen enters the inside of the substrate, oxidization proceeds.

In a MOSFET using an SiC (4H—SiC) substrate of a 4H structure, the mobility of the SiC substrate/SiO$_2$ insulating film interface becomes extremely low. Even if thoughtful devising is made for the insulating film and interface, only the mobility (less than 100 cm$^2$/Vs) that is far apart from the characteristic (1000 cm$^2$/Vs) that 4H—SiC originally has is obtained.

On the other hand, in a MOSFET using an SiC (6H—SiC) substrate of a 6H structure, the mobility of the SiC substrate/SiO$_2$ insulating film interface becomes sufficiently high. The withstand voltage of the 6H structure is 3.0 MV/cm and is equivalent to or higher than the withstand voltage (2.8 MV/cm) of the 4H structure. However, the electron mobility in the substrate used as a bulk is low and the structure is difficult to be used as a vertical MOSFET.

Further, in a MOSFET using an SiC (3H—SiC) substrate of a 3C structure, the mobility of the SiC substrate/SiO$_2$ insulating film interface becomes sufficiently high. However, the device has a strong tendency to become normally on and is difficult to be used. Additionally, the withstand voltage of the 3C structure is 1.5 MV/cm and is insufficient in comparison with the withstand voltage (2.8 MV/cm) of the 4H structure.

BRIEF DESCRIPTION OF THE DRAWINGS

FIG. 3 is a cross-sectional view showing the element structure of a DiMOSFET according to a first embodiment.

FIG. 6 is a cross-sectional view showing the element structure of an IGBT according to a second embodiment.

FIG. 7 is a cross-sectional view showing the element structure of a trench vertical MOSFET according to a modification.

FIG. 8 is a cross-sectional view showing the enlarged main configuration of FIG. 7.

DETAILED DESCRIPTION

In general, according to one embodiment, an SiC semiconductor device comprises a p-type 4H—SiC region formed on at least part of a surface portion of an SiC substrate, a defect reduction layer formed on a surface portion of the 4H—SiC region, a gate insulating film formed on the defect reduction layer, and a gate electrode formed on the gate insulating film. The defect reduction layer has the C defect density that is defined as follows and is set to Cdef<10$^{15}$ cm$^{-3}$ by introduction of carbon.

$$C\text{def}=\{[\text{Si density}]+[p\text{-type dopant density}]-[C \text{ density}]\}$$

First, the basic idea for solving the problem is explained before explaining the embodiments of this invention.

[Explication of Mechanism]

In a MOSFET using a 4H—SiC substrate, it is understood that a large number of interface states are present on an SiC substrate/SiO$_2$ gate insulating film interface and the states cause the mobility to be reduced. However, the origin thereof is not made clear.

Conventionally, the above problem is considered to be caused by the presence of a carbon cluster or the like created on the SiO$_2$ gate insulating film side of the SiC substrate/SiO$_2$ insulating film interface. By thus considering, it becomes difficult to understand why "the normally on state occurs in the MOSFET using the 3C—SiC substrate". Further, it is impossible to understand the present state in which "a MOSFET using a 4H—SiC substrate with sufficiently high mobility cannot be formed even if an insulating film formation process is thoughtfully devised". Therefore, it is necessary to understand the reason why the interface mobility is low and propose an improving method based on the reason.

[Consideration of Electronic State of C Defects in SiC Substrate]

Figures 1A, 1B, 1C:
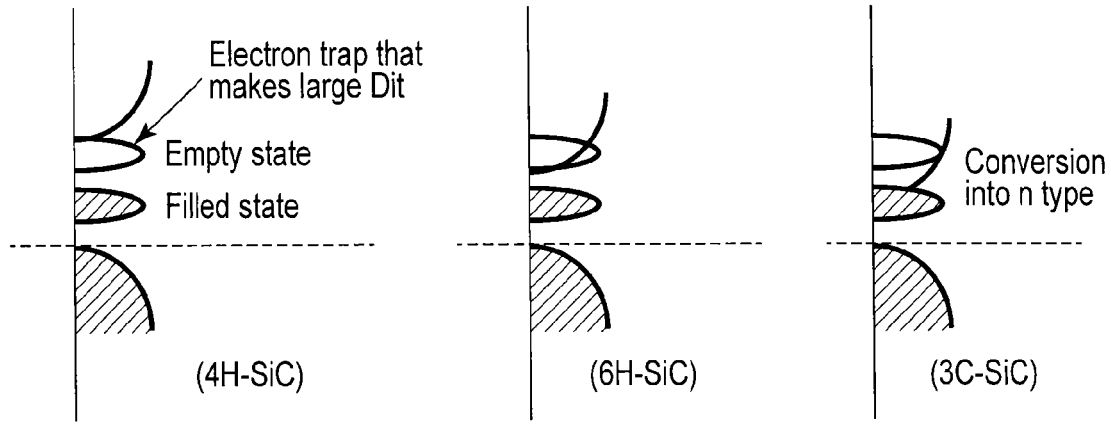
FIGS. 1A to 1C are schematic diagrams for illustrating the electronic state of C defects in an SiC substrate.

The electronic states of C defects in 4H—SiC and 3C—SiC are derived by use of a first principle calculation. In this case, the first principle calculation is based on density functional theory by use of local density approximation. A norm-conserving pseudopotential is used for Si and a ultrasoft pseudopotential developed by Vanderbilt et al., is used for a material such as C other than Si. FIGS. 1A, 1B and 1C are schematic diagrams for illustrating the state densities of C defects in 4H—SiC, 6H—SiC and 3C—SiC, respectively.

If C defects occur in the substrate, four Si atoms surrounding the C defect each have one dangling bond. The dangling bond of Si has a state near the intermediate portion of a band gap of SiC. Therefore, if the dangling bonds of the four Si atoms surrounding the C defect interact, the dangling bonds are divided into two groups of two "filled states" and two "empty states" and four states in total are acquired. Then, two states (one filled state and one empty state) among the above states appear in the gap of 4H—SiC. The filled state of the other two states is present inside the valence band of 4H—SiC, the empty state is present inside the conduction band of 4H—SiC and the states do not appear in the gap of 4H—SiC.

The energy positions of the conduction band and valence band vary depending on the structure (polytype) of SiC. Therefore, the positional relationship of the "filled state" and "empty state" in the gap caused by interaction of the dangling bonds of Si depends on the structure of SiC.

As shown in FIG. 1A, an "empty state" occurs directly under the conduction band in the 4H structure. This state becomes a cause of reducing the mobility since electrons are trapped. On the other hand, as shown in FIG. 1C, in the 3C structure, it is proved for the first time based on the present calculation that the "filled state" and the conduction band are related to each other and the 3C—SiC substrate itself is converted into an n type if C defects are introduced therein. As a result, a mechanism that sets a normally on state if a MOSFET with a 3C—SiC substrate is formed can be explicated. That is, this is because the channel portion of an n-channel MOSFET is converted into an n type. The point that the normally on state occurs is a point of doubt that cannot be explained at all based on charge trapping in the C cluster of $SiO_2$.

As shown in FIG. 1B, in the 6H structure, the bottom of the conduction band is lowered to take in the whole portion of the "empty state" appearing directly under the conduction band of the 4H structure. As a result, it is well understood that electrons are not trapped and high mobility is obtained in a MOSFET using a 6H—SiC substrate. However, in the 6H structure, since the electron mobility of the bulk is rather low, the structure is unsuitable for a vertical MOSFET.

From the above description, it is understood that C defects in the 4H—SiC substrate is one of the causes that reduce the mobility of the MOSFET and the charge trapping in $SiO_2$ is not only one cause of the above problem.

[Defect Generation Mechanism Near Substrate Surface]

Defect generation energy in the SiC substrate surface is derived by use of the first principle calculation. Energy required for C defect generation on the most surface of the C face of the SiC substrate is 0.75 eV and energy required for Si defect generation on the most surface of the Si face of the SiC substrate is 4.6 eV. Since the element on the most surface of the SiC substrate that is not subjected to hydrogen termination has dangling bonds, it is set in a high-energy state and is easily separated to generate defects.

Near the SiC/$SiO_2$ insulating film interface, internal elements (C and Si) and defects generated on the surface are diffused while they are being exchanged for each other. It is thus understood that a large number of defects occur in the SiC substrate near the SiC/$SiO_2$ insulating film interface.

Next, defect generation energy in the SiC substrate is derived by use of the first principle calculation. It is understood that energy required for C defect generation is 4.0 eV, energy required for Si defect generation is 7.5 eV and C defects occur most easily in the SiC substrate.

Figure 2:
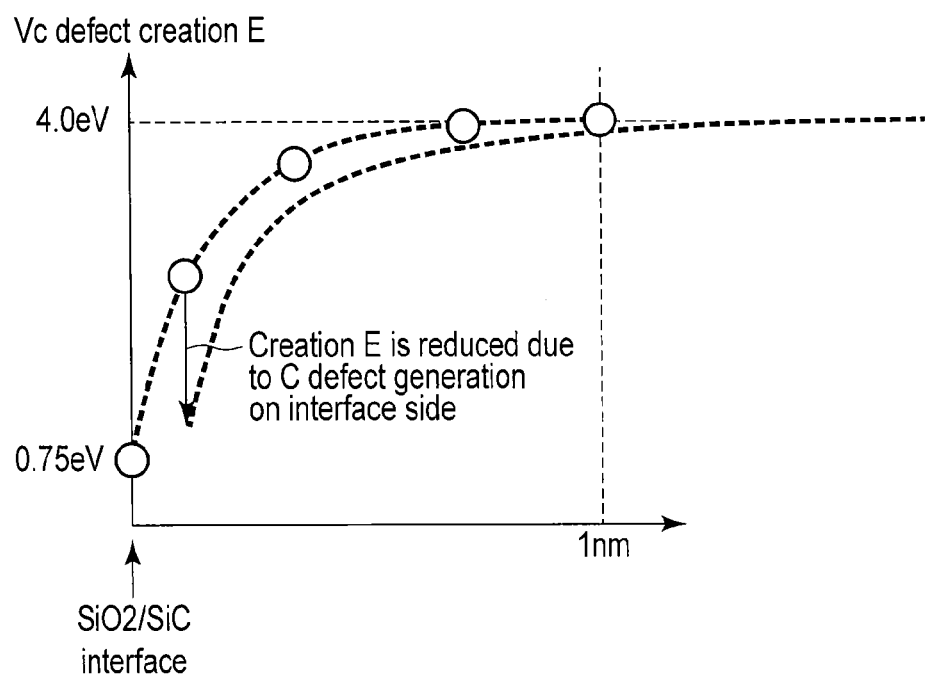
FIG. 2 is a characteristic diagram showing the defect generation energy of a portion near the SiC substrate/SiO$_2$ interface.

In FIG. 2, the states described above are shown in a graph form. It is indicated that C defects easily occur in the SiC/$SiO_2$ insulating film interface than in the SiC substrate due to the effect of releasing of distortion near the surface and the presence of dangling bonds. Further, if C defects once occur, the tendency to generate C defects inside thereof becomes stronger. Like the above case, this is because dangling bonds newly occur and the releasing of distortion becomes easy due to formation of a space. That is, C defects occur easily near the interface. Thus, C defects tend to occur over a range of several nanometers from the interface to the interior. The portion of several nanometers is a portion that forms a channel and gives an extremely great influence to the mobility.

C defect generation energy in the internal portion of the SiC substrate is 4 eV. In the substrate, C defects of approximately $10^{13}$ cm$^{-3}$ occur (epitaxial growth at approximately 1300° C.). Therefore, it is considered that C defects of $10^{18}$ cm$^{-3}$ are generated even at approximately room temperature if the C defect generation energy of the interface is 0.75 eV. Further, it is considered that C defects of approximately $10^{18}$ cm$^{-3}$ will occur in a range of approximately 3 nm from the interface since some temperature is added in the case of formation of an $SiO_2$ film.

Thus, a large number of interface C defects occur in the SiC/$SiO_2$ insulating film interface. The reason why "a 4H-structure MOSFET with sufficiently high mobility cannot be formed even if an insulating film formation process is thoughtfully devised" that influences the mobility in the MOSFET using a 4H—SiC substrate can be understood. Further, the reason why "the tendency to set the MOSFET using a 3C—SiC substrate into a normally on state becomes strong" that appears as a phenomenon that the channel becomes an n type in the MOSFET using a 3C—SiC substrate is also understood.

In the embodiment, a vertical double-implanted metal oxide semiconductor field-effect transistor (DiMOSFET) in which the amount of C defects on the 4H—SiC interface is drastically reduced is provided. Therefore, it is featured that carbon atoms are supplied to supplement carbon defects after formation of the MOS interface. Specifically, carbon (C) is ion-implanted near the MOS interface immediately before or after a formation step of the gate insulating film of a vertical DiMOSFET using a 4H—SiC substrate. Then, the structure is subjected to an annealing process at a low temperature after the gate insulating film is formed. At this time, since carbon introduced by ion-implantation can be diffused between lattices (the barrier of diffusion of C between lattices is 0.5 eV or less and C can be diffused even at a low temperature), a large number of C defects can be filled. The important point is that a high-temperature annealing process is not performed. If the high-temperature annealing process is performed, C between the lattices is diffused at high speed and disappears from a portion near the MOS interface and, as a result, C defects near the interface cannot be filled.

In the final structure of the SiC semiconductor device that is obtained through the present process, the amount of C defects (Vc) is markedly reduced in comparison with a conventional case. Owing to this, the interface level density can also be markedly reduced. As a result, a sufficiently large value of 150 to 350 cm$^2$/Vs can be obtained as the mobility. Typically, the mobility becomes equivalent to that (approximately 300 cm$^2$/Vs) of the SiC/$SiO_2$ interface. At this time, in the case of 150 cm$^2$/Vs, a small amount of Vc still remains. It can be considered that 350 cm$^2$/Vs is the upper limit when a normal Si/$SiO_2$ interface is formed. That is, the amount of C defects and the interface level density are strongly related and a MOS interface having a markedly reduced interface level density can be formed by controlling the ratio (amount of C)/(amount of Si).

[Extra Carbon in 4H—SiC Substrate]

When extra C remains in the 4H—SiC substrate, the following state can be considered. First, a case wherein C is present between lattices is considered. At this time, C is easily diffused between the lattices and diffused in the substrate during the normal annealing process to move to the exterior. Next, a case wherein interstitial carbon (Ci) forms a dimer (Ci2) is considered. At this time, carbon can be stably present between the lattices, but a localization state in which electrons can be trapped in gaps is not provided although it is confirmed by calculating the electronic state. Therefore, even if Ci2 is present near the MOS interface, no influence is given to the mobility. Particularly, since a large amount of oxygen is present near the interface, carbon is oxidized to form CO and is discharged externally. Further, there is a possibility that C that replaces Si is present. The electronic state at this time is confirmed based on calculation, but a localization state in which electrons can be trapped in gaps is not provided and even if C that replaces Si is present near the MOS interface, no influence is given to the mobility.

Thus, it is understood that a large influence is not given to the mobility on the MOS interface even when extra carbon is present on the 4H—SiC substrate side is present. That is, no serious problem occurs if the amount of C is large within an adequate range.

[Amount of C Defects]

It is understood that only C defects of the order of $10^{13}$ cm$^{-3}$ or less are present in an SiC substrate formed by epitaxial growth, but the amount of C defects is rapidly increased if ions such as dopants are implanted. The amount reaches $10^{17}$ cm$^{-3}$ even with a low dose. Thus, since C defects are easily generated, it is highly sensitive to implant damage.

Further, it is often reported that the interface state density of $1\times10^{18}$ cm$^{-3}$ or more ($1\times10^{12}$ cm$^{-2}$ or more in terms of the surface density) is present in an actual MOSFET using a 4H—SiC substrate. Since each C defect in the substrate has the ability of putting in or taking out four electrons, the density corresponds to $2.5\times10^{17}$ cm$^{-3}$ or more in terms of the amount of C defects. For example, the interface state density is distributed in a range of $8.9\times10^{16}$ cm$^{-3}$ ($2\times10^{11}$ cm$^{-2}$ in terms of the surface density) or more to $8.9\times10^{19}$ cm$^{-3}$ ($2\times10^{13}$ cm$^{-2}$ in terms of the surface density) or less. This corresponds to $2.2\times10^{16}$ cm$^{-3}$ or more to $2.3\times10^{19}$ cm$^{-3}$ or less in terms of the amount of C defects.

Further, the amount of p-type dopant in a MOSFET using a 3C—SiC substrate is $1\times10^{18}$ cm$^{-3}$, but the device tends to become normally on. If C defects are generated in 3C—SiC, two electrons are supplied to each of the valence band and conduction band. That is, in 3C—SiC, C defects behave as donors. This is a characteristic that is not present in 6H—SiC or 4H—SiC. If the device tends to become normally on, it is considered that C defects of $5.0\times10^{17}$ cm$^{-3}$ or more are present in terms of the amount of C defects.

[Definition of Concentration]

C defects that give large influence to the mobility are distributed in a range of 3 nm or less on the 4H—SiC side near the 4H—SiC/SiO$_2$ interface. In this case, if no extra C is present, C defect density Cdef may be expressed as follows.

$C$def=|[Si density]+[$p$-type dopant density]−[$C$ density]|

C defect density Cdef must be set sufficiently low to increase the mobility. In the conventional experiments, density Cdef can be set to as low as approximately $2\times10^{16}$ cm$^3$ and the mobility at this time is approximately 100 cm$^2$/Vs at maximum. This applies to a case where the channel is formed by epitaxial growth.

Since the target value of the mobility is 150 cm$^2$/Vs or more, C defect density Cdef must be set to a value of the order of $10^{15}$ cm$^{-3}$ or less. At this time, interface state density is about Dit=$2\times10^{10}$ cm$^{-2}$.

Further, C defect density Cdef is preferably set to the order of $10^{14}$ cm$^{-3}$ or less and, at this time, the mobility is set to 200 cm$^2$/Vs. When the amount of C defects approaches $10^{13}$ cm$^{-3}$, the mobility is set to approximately 350 cm$^2$/Vs and if the amount of C defects decreases more, the mobility is kept unchanged.

C defect density Cdef estimated based on the charge density becomes at least $2\times10^{16}$ cm$^{-3}$ or more in the conventional experiment. Therefore, it becomes necessary to implant carbon ions of $2\times10^{16}$ cm$^{-3}$ or more in an adequate region of ±5 nm from the interface near the SiO$_2$/Si interface. However, in this case, it is desired to implant ions as softly as possible. The best way is to softly implant ions on the SiO$_2$ side.

[C Defect Introduction Position and Amount Thereof]

As described above, C defects are distributed in a region of 3 nm or less in the depth direction of the channel. It is desired to implant C near the above position by ion implantation. Since the interaction between C defects and C is approximately 2 nm, it is preferable to set the peak within a region of 5 nm. It is considered based on the conventional experiment that the amount of C defects after the process can be reduced to $2\times10^{16}$ cm$^{-3}$ or less. Therefore, it is necessary to introduce ions in an amount larger than the above value to obtain the peak value. When C is introduced on the insulating film side, C can be easily diffused. Judging from the C implantation amount, it is considered to be adequate to set the implantation distance within 5 nm. This is because the amount of C to be implanted must be increased and serious damage may be given to the insulating film if the distance farther than the above value is set.

If the ion implantation amount is fixed at $5\times10^{16}$ cm$^{-3}$ and the peak position is changed as the position from the interface, it can be observed that the mobility is rapidly reduced in a range of 5 nm or more on the substrate side and 5 nm or more on the insulating film side. This means that C defects cannot be fully filled. Further, when the peak position is fixed at 2 nm on the substrate side and the ion implantation amount is changed, the mobility is rapidly reduced in a range of $2\times10^{16}$ cm$^{-3}$ or less. This is also considered that the amount of C is insufficient. In the process of this embodiment, the best value is approximately $5\times10^{16}$ cm$^{-3}$. Since the implant damage problem and the cost problem occur if C is introduced by an excessive amount, it is desirable to set as small an amount as possible. The upper limit is the maximum value ($2.3\times10^{19}$ cm$^{-3}$) of the expected amount of C defects, but at present, the amount can be reduced to an amount smaller by two or three digits.

Most carbon is annealed out externally, but extra C in SiO$_2$ can deactivate the trap state by use of nitrogen or the like. Further, extra C in SiC does not cause the above problem.

[Termination Structure]

The termination structure of the whole device structure is normally formed by ion implantation and the same method may be used at this time. Further, if a strong termination structure is required, a method of filling an SiO$_2$ oxide film by shallow trench isolation (STI) is effective.

An SiC semiconductor device of the embodiment is explained below with reference to the drawings.

First Embodiment

FIG. 3 is a cross-sectional view showing the element structure of an SiC semiconductor device according to a first embodiment and particularly shows a case where the embodiment is applied to a DiMOSFET.

A low-concentration n-type (n$^-$-type) 4H—SiC layer 102 is formed on the surface of a high-concentration n-type (n$^+$-type) silicon carbide (4H—SiC) substrate 100. In this embodiment, the structure obtained by forming the SiC layer 102 on the SiC substrate 100 is used as an element forming substrate. The n$^-$-type SiC layer 102 is formed with an impurity concentration lower than that of the n$^+$-type SiC substrate 100 and used as a withstand voltage holding layer. SiC is formed with various structures (polytype), but in this embodiment, the 4H structure is used as the SiC structure. This is because the 4H structure is optimum to form a power device since the 4H structure has the highest withstand voltage and the mobility in the bulk is the highest.

An electrode 160 of a conductive material is formed on the back of the SiC substrate 100. The electrode 160 is used as a drain electrode (second conduction electrode). The electrode 160 is formed by use of Ni/Ti vapor deposition or the like. Then, the electrode is subjected to an annealing process at 1000° C., for example, to make ohmic contact with the back of the SiC substrate 100.

A plurality of low-concentration p-type (p⁻-type) SiC regions (first 4H—SiC regions) 121 with preset film thickness are selectively formed separately with spaces from one another from the surface of the SiC layer 102 to the intermediate portion in the depth direction on portions of the surface of the SiC layer 102. In each semiconductor element, two SiC regions 121 are arranged to sandwich the surface region of the SiC layer 102. The two SiC regions 121 are arranged in a ring form, honeycomb form or the like and continuously formed with each other. In the cross-sectional view of FIG. 3, the structure taken along the central line of the element is shown. This applies to the following description. The elements are arranged parallel to one another, currents are passed through the whole portion and the elements are switched according to voltages applied to the electrodes.

High-concentration n-type (n⁺-type) SiC regions (second 4H—SiC regions) 122 with preset film thickness are selectively formed from the surface of the SiC region 121 to the intermediate portion in the depth direction on portions of the surface of the respective SiC regions 121. Further, p-type (p⁺-type) SiC regions (third 4H—SiC regions) 123 are each formed adjacent to the SiC region 122 on part of the surface of the corresponding SiC region 121.

Thus, the p-type SiC regions 121 are selectively formed on at least portions of the n-type SiC layer 102 and each arranged to be connected to the n-type SiC region 122 and p-type SiC region 123. In the example of FIG. 3, a case wherein the adjacent n-type SiC region 122 and p-type SiC region 123 are respectively arranged one on the portion of the surface of each SiC region 121 is shown. When one semiconductor element is formed, two p-type SiC regions 123 are arranged to sandwich two n-type SiC regions 122. In other words, in each semiconductor element, the p-type SiC regions 123 are arranged outside the n-type SiC regions 122. Further, in the respective SiC regions 121, channel regions 124 that are electrically conductive to the n-type SiC layer 102 are formed inside the n-type SiC regions 122.

An insulating film 130 is formed to extend over portions of the surfaces of the two n-type SiC regions 122. The insulating film 130 acts as a gate insulating film and is formed of an $SiO_2$ oxide film, for example. The gate insulating film 130 is formed in contact with the surfaces of the n-type SiC regions 122 on both sides thereof, the surfaces of the SiC regions 121 on which the n-type SiC regions 122 and p-type SiC regions 123 are not formed and the surface of the p-type SiC layer 102 used as a channel-channel region between the two p-type SiC regions 121.

A gate electrode 140 is formed on the gate insulating film 130. Thus, the gate electrode 140 is formed to extend over portions of the n-type SiC regions 122 on both sides thereof, partial regions (that act as channels 124 of a MOSFET) of the SiC regions 121 on which the n-type SiC regions 122 and p-type SiC regions 123 are not formed and the n-type SiC layer 102 used as a channel-channel region between the two SiC regions 121 with the gate insulating film 130 disposed therebetween.

Further, electrodes 150 are formed on different portions of the surfaces of the n-type SiC regions 122 and the surfaces of the p-type SiC regions 123. The electrode 150 acts as a source electrode (first conduction electrode). The source electrode 150 is formed of Al/Ni or the like, formed at a temperature of approximately 800° C. and formed in ohmic contact with the p-type SiC region 123. The p-type SiC region 123 is used as a substrate contact region in a MOS device. At the same time, the source electrode 150 is formed in ohmic contact with the n-type SiC region 122. The n-type SiC region 122 is used as a source region in the MOS device.

In the first embodiment, p⁻-type ions are implanted to form the p-type SiC regions 121 and the $SiO_2$ film 130 is formed, and therefore, C defects occur. The C defect generation mechanism is as described before. C defects can be stabilized (the gain of approximately 4 eV is obtained for each C defect in the substrate) by filling C if extra C is present. That is, if extra C is introduced in the MOS interface and diffused near the MOS interface, the characteristic of the MOS interface can be improved by filling the C defects.

Figure 4:
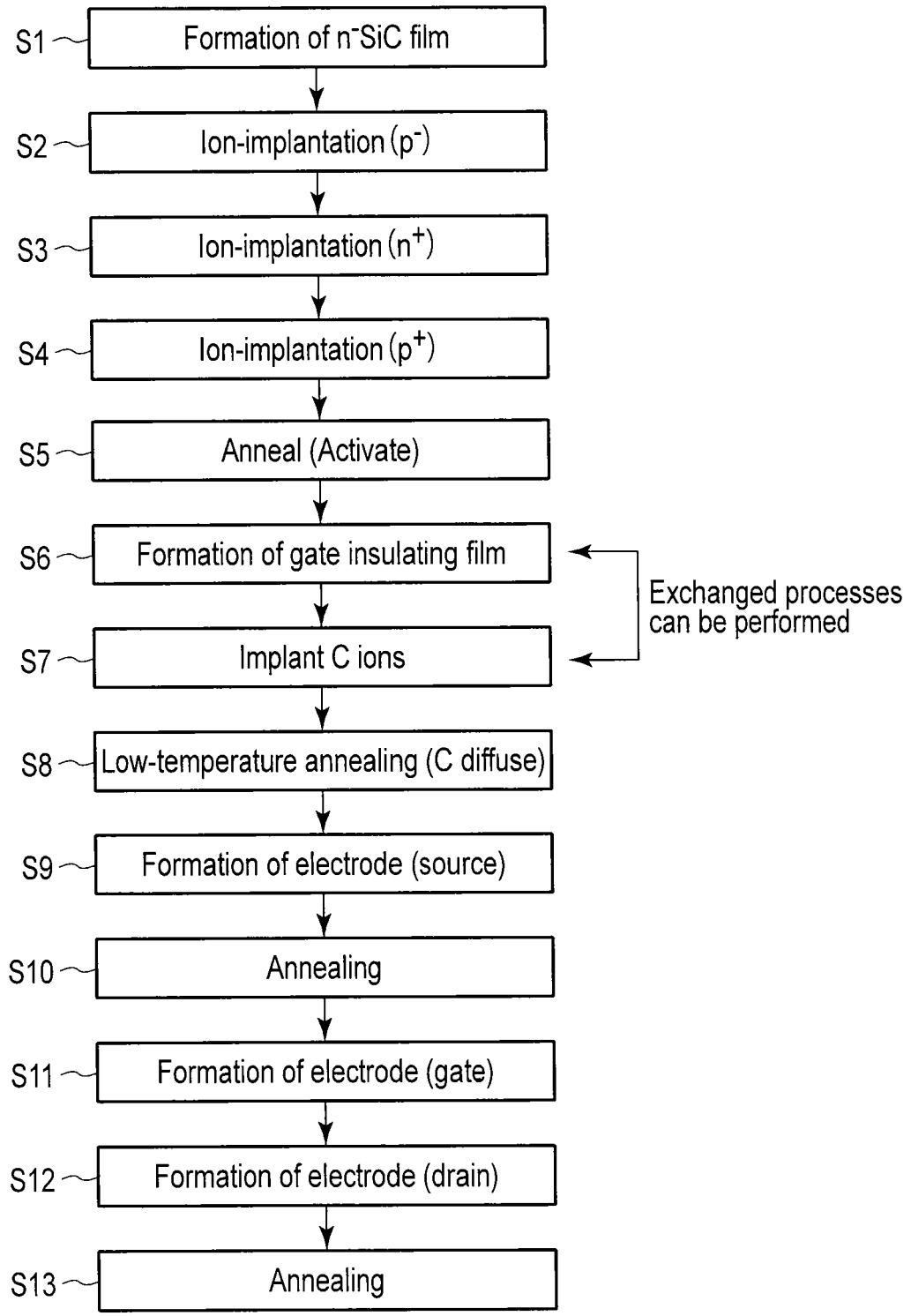
FIG. 4 is a flowchart for illustrating the manufacturing process of the DiMOSFET according to the first embodiment.

The manufacturing process of the SiC semiconductor device of this embodiment based on the above idea is shown in the flowchart of FIG. 4. As shown in FIG. 4, in this embodiment, a series of steps including an n⁻-type SiC film formation step (S1), an ion-implantation step (S2) for conversion to a p⁻ type, an ion-implantation step (S3) for conversion to an n⁺ type, an ion-implantation step (S4) for conversion to a p⁺ type, a high-temperature annealing step (S5) for activation, gate insulating film formation step (S6), carbon (C) ion-implantation step (S7), a low-temperature annealing step (S8) for C diffusion between lattices, source electrode formation step (S9), annealing step (S10), gate electrode formation step (S11), drain electrode formation step (S12) and annealing step (S13) is performed.

Process cross-sectional views showing steps performed according to the flowchart of the manufacturing method of the SiC semiconductor device of the first embodiment are shown in FIGS. 5A to 5G.

In FIGS. 5A to 5D, a process from the n⁻-type SiC film formation step (S1) to the ion-implantation step (S4) of FIG. 4 is shown.

Figure 5A:
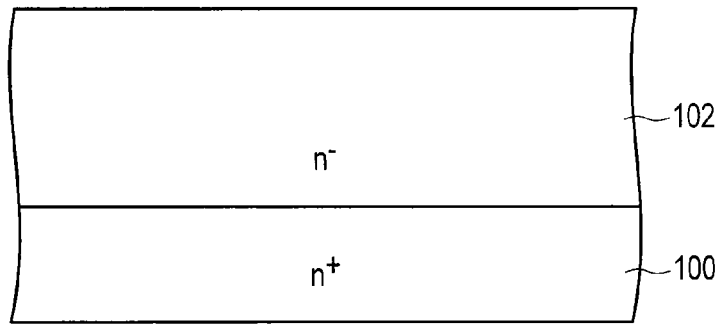
FIGS. 5A to 5G are cross-sectional views for illustrating the manufacturing steps of the DiMOSFET according to the first embodiment.

First, as shown in FIG. 5A, as the n⁻-type SiC film formation step (S1), an n⁻-type 4H—SiC layer 102 is formed on the surface of an n⁺-type 4H—SiC substrate 100. As the SiC substrate 100, for example, a solid-state single crystalline SiC substrate is used. It is preferable to set the impurity concentration (doping concentration) of the n-type SiC substrate 100 to $1 \times 10^{16}$ atoms/cm³ or more and less than $1 \times 10^{20}$ atoms/cm³. In this case, for example, the substrate is formed with the concentration of $6 \times 10^{17}$ cm⁻³. In the following embodiments, a substrate with the substrate concentration of $6 \times 10^{17}$ cm⁻³ is used as the substrate irrespective of a p type or n type when not particularly pointed out. It is preferable to use a hexagonal-system SiC substrate (4H—SiC substrate) of a (0001) plane as the SiC substrate 100. In the embodiment, the (0001) plane is used, but another plane orientation such as a (000-1) plane may be effectively used.

The SiC layer 102 is formed by epitaxially growing and forming an n⁻-type 4H—SiC film on the surface of the SiC substrate 100 by use of an epitaxial vapor deposition method. At the time of formation of the epitaxial layer, for example, $SiH_4$ gas and $C_3H_8$ gas can be used as material gas. Further, as impurity (dopant), nitrogen (N) or phosphorus (P) may be used. The SiC layer 102 is used as a withstand voltage holding layer. The film thickness of the SiC layer 102 is preferably set in the range of 5 to 100 μm, for example, and must be made larger in a device with a higher withstand voltage. In this case, the film thickness is set to 10 μm, for example. Further, it is preferable to set the impurity concentration (doping concentration) of the n-type SiC layer 102 to $8\times10^{14}$ cm$^{-3}$ or more and less than $3\times10^{17}$ cm$^{-3}$. In this case, for example, the layer formed with the concentration of, for example, $5\times10^{15}$ cm$^{-3}$ is used. In the following embodiments, the concentration of $5\times10^{15}$ cm$^{-3}$ is used as the concentration of n$^{-}$-type SiC when not particularly pointed out.

Figure 5B:
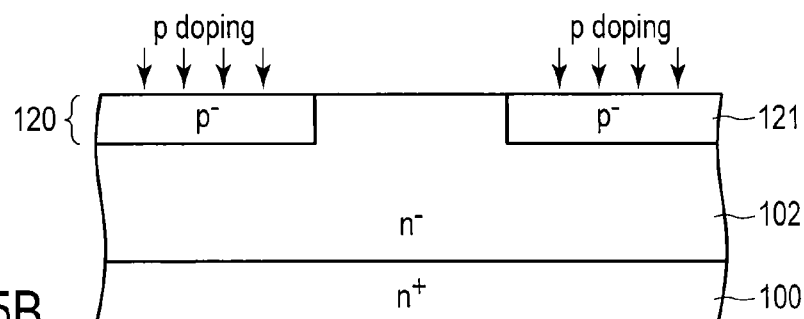

Next, as shown in FIG. 5B, as the ion-implantation step (S2) for conversion to a p$^{-}$ type, an oxide film (not shown) formed by use of a photolithography and etching process is used as a mask and impurity of a p conductivity type is selectively doped into the surface region 120 of the SiC layer 102. As a result, p$^{-}$-type 4H—SiC regions 121 are formed.

The concentration of the conductive impurity in the p-type SiC region 121 can be set to $1\times10^{16}$ cm$^{-3}$, for example. In the following embodiments, the concentration of $1\times10^{16}$ cm$^{-3}$ is used as the concentration of p$^{-}$-type SiC when not particularly pointed out. As the condition of implantation of Al ions used as p-type impurity, for example, the condition of $1\times10^{15}$ cm$^{-2}$ and 80 keV can be used. In this case, for example, the substrate is heated to 300° C. The concentration of the conductive impurity in the p-type SiC region 121 is preferably set in the range of $1\times10^{13}$ to $5\times10^{17}$ cm$^{-3}$. More preferably, the concentration may be set in the range of $1\times10^{15}$ to $5\times10^{16}$ cm$^{-3}$.

Figure 5C:
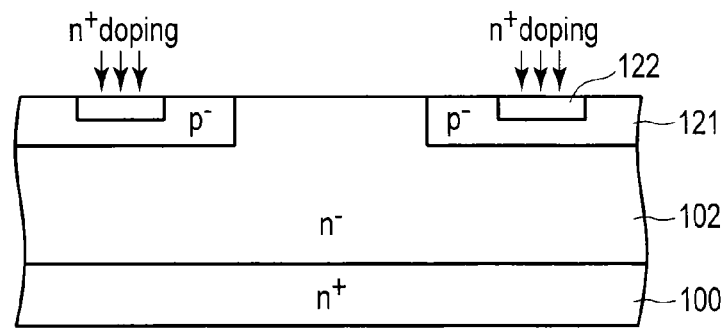

Next, as shown in FIG. 5C, as the ion-implantation step (S3) for conversion to an n$^{+}$ type, n-type conductive impurity is selectively doped into portions of the surfaces of the SiC regions 121 to form n$^{+}$-type 4H—SiC regions 122. Specifically, after the mask of the oxide film used for formation of the SiC regions 121 is removed, a mask (not shown) of an oxide film having a new pattern is formed again by use of a photolithography and etching process. Then, n-type conductive impurity is doped via the openings of the new mask to form the n-type SiC regions 122.

The concentration of the conductive impurity in the p-type SiC region 122 can be set to $2\times10^{20}$ cm$^{-3}$, for example. In the following embodiments, the concentration of $2\times10^{20}$ cm$^{-3}$ is used as the concentration of n$^{+}$-type SiC when not particularly pointed out. As the condition of implantation of N ions used as n-type impurity, for example, the condition of $1\times10^{15}$ cm$^{-2}$ and 40 keV can be set. In this case, for example, the substrate is heated to 300° C. The concentration of the conductive impurity in the n-type SiC region 122 is preferably set in the range of $1\times10^{14}$ to $5\times10^{20}$ cm$^{-3}$. More preferably, the concentration may be set in the range of $5\times10^{15}$ to $3\times10^{20}$ cm$^{-3}$.

Figure 5D:
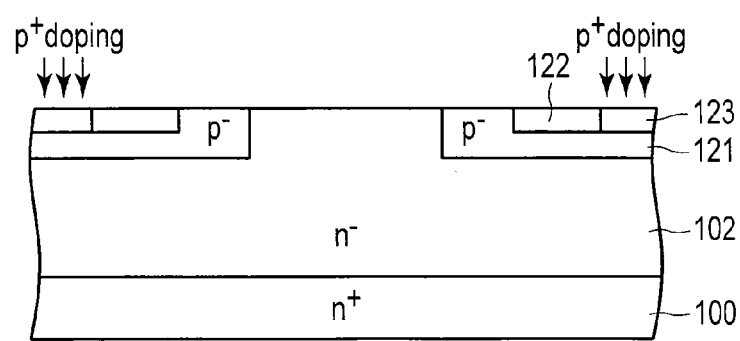

Next, as shown in FIG. 5D, as the ion-implantation step (S4) for conversion to a p$^{+}$ type, p-type conductive impurity is selectively doped into different portions of the surfaces of the SiC regions 121 to form p$^{+}$-type 4H—SiC regions 123 adjacent to the SiC regions 122. Specifically, after the mask of the oxide film used for formation of the SiC regions 122 is removed, a mask (not shown) of an oxide film having a new pattern is formed again by use of a photolithography and etching process. Then, p-type conductive impurity is doped via the openings of the new mask to form the p-type SiC regions 123.

The concentration of the conductive impurity in the p-type SiC region 123 can be set to $2\times10^{20}$ cm$^{-2}$, for example. As the condition of implantation of Al ions used as p-type impurity, for example, the condition of $1\times10^{15}$ cm$^{-2}$ and 40 keV can be set. In this case, for example, the substrate is heated to 300° C. The concentration of the conductive impurity in the p-type SiC region 123 is preferably set in the range of $1\times10^{14}$ to $5\times10^{20}$ cm$^{-2}$. More preferably, the concentration may be set in the range of $5\times10^{15}$ to $3\times10^{20}$ cm$^{-2}$.

Next, as the annealing step (S5), an activation annealing process is performed after the implantation step described above. As the activation annealing process, the condition of heating temperature 1600° C. and heating time 30 minutes can be used by using argon (Ar) gas as atmospheric gas, for example. Thus, the structure shown in FIG. 5D can be obtained. At this time, activation of dopant introduced in SiC can be realized, but almost no diffusion occurs.

At the time of formation of the SiC regions 121 to 123, carbon ions are often simultaneously doped. Of course, in this example, carbon ions can be simultaneously doped. However, since the high-temperature annealing step (S5) is performed after this, extra carbon ions are diffused into the SiC layer 102 and substrate 100 or externally and are not left behind in the SiC regions 121. As a result, a variation in the characteristic of the MOS interface depending on the presence or absence of simultaneous doping of carbon ions at this stage is set at an unobservable level.

Figure 5E:
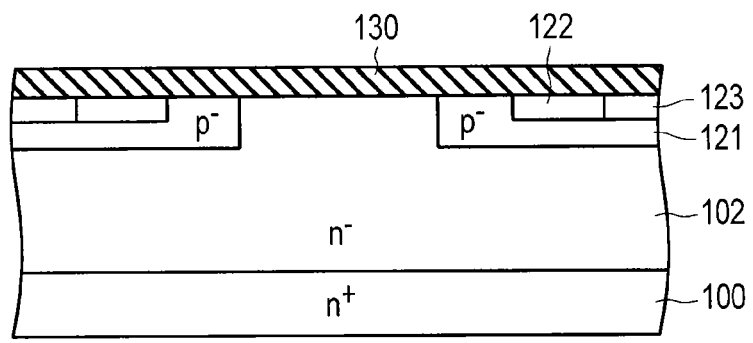
Figure 5F:
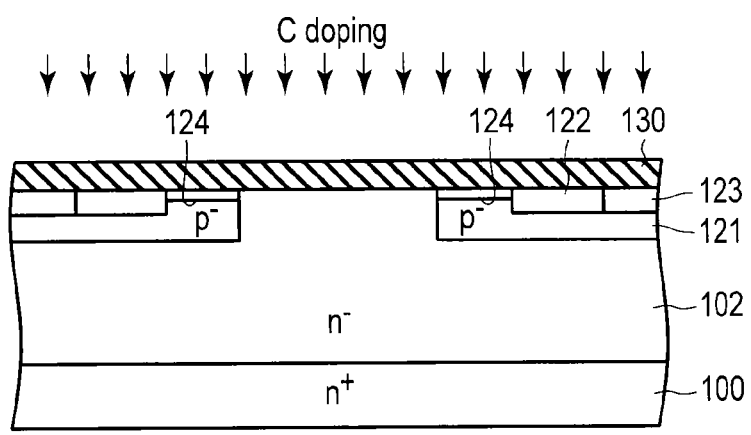
Figure 5G:
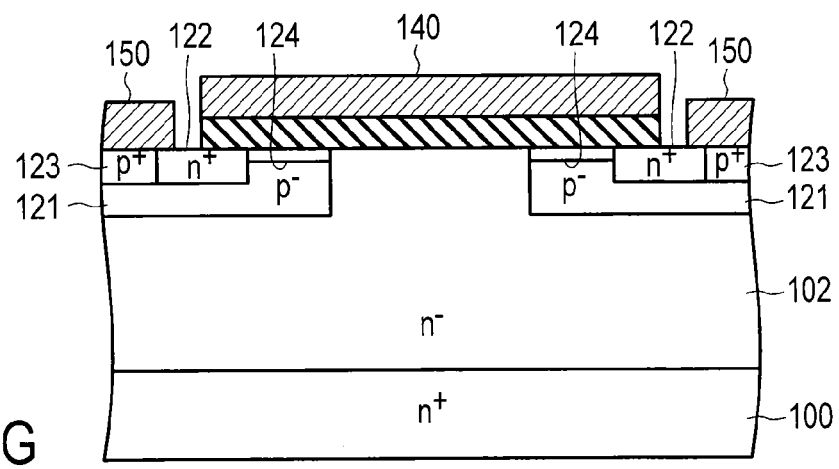

In FIGS. 5E to 5G, the process from the insulating film formation step (S6) to the electrode (gate electrode) formation step (S11) of FIG. 4 is shown.

As shown in FIG. 5E, as the insulating film formation step (S6), an oxide film (gate insulating film) 130 is formed to cover the entire surfaces of the SiC layer 102 and SiC regions 121, 122 and 123. As the method for formation of the oxide film 130, for example, a dry oxidation (thermal oxidation) method may be used. For example, a fine oxide film can be formed by use of the dry oxidation method in the condition of 1200° C. and heating time 30 minutes, for example. Further, it is possible to reduce the time and form an extremely thin dry oxide film and form a deposition film on the oxide film by use of a CVD method or the like.

Next, as shown in FIG. 5F, as the C ion-implantation step (S7), carbon ions are implanted. It is important to implant carbon ions to have the peak (in this embodiment, it is set to approximately $5\times10^{16}$ cm$^{-3}$ and the peak position is set to approximately 3 nm) on the SiC region 121 side of the MOS interface formed between the gate insulating film 130 and the SiC region 121 and implant carbon ions as softly as possible. That is, attention must be paid to implant carbon ions with the minimum necessary acceleration voltage and minimum necessary density and not to form an amorphous portion. As the condition of C ion implantation, for example, the condition of $1\times10^{13}$ cm$^{-2}$ and 10 keV can be set.

Thus, a process of ion-implanting C in the state in which an SiO$_2$ film is formed on the SiC channel is easily and stably performed and suppresses the interface roughness. At this time, C defects and Si defects are partly filled by C and electron traps are removed. This is the best mode. C may be introduced into the Si defects. Further, no problem occurs even if C clusters are formed. It is sufficient only if C defects are reduced.

It is desired to introduce to-be-implanted C as softly as possible in a portion near the interface. This is because it is desired to prevent creation of C defects as far as possible at the implantation time. In this example, the peak is set on the SiC region 121 side of the MOS interface, but C may be introduced to set the peak on the gate insulating film 130 side and then diffused from the position. C remaining in SiO$_2$ can be removed in the later process. C remaining in SiC and lying between the lattices is annealed out. The other C will not give a large influence to the mobility.

The condition of C ion implantation depends on the thickness of the gate insulating film. A gate insulating film may be additionally formed after the C ion implantation step (S7). Further, the order of the insulating film formation step (S6)

and C ion implantation step (S7) may be changed and a gate insulating film can be formed after the C ion implantation.

After the insulating film formation step (S6) and C ion implantation step (S7), the substrate is heated to 100° C. as the low-temperature annealing step (S8). As a result, implanted extra C ions are slowly diffused between the lattices and can fill C defects lying on the SiC region 121 side of the MOS interface. That is, a defect reduction layer is formed on each channel region 124 under the gate electrode. Since C defects become stable by 4 eV if C is filled therein, the C defects can be filled to an amount of C defects ($10^{13}$ cm$^{-3}$) or less obtained at the epitaxial growth time. Since the temperature is lower than that at the time of epitaxial growth and the entropy effect becomes weak, C defects can be reduced to a smaller amount. That is, the amount of C defects can be reduced to $10^{13}$ cm$^{-3}$ or less.

If it is desired to set the entropy effect to be as weak as possible, the lower temperature is preferable. However, since C does not diffuse (the diffusion barrier is approximately 0.5 eV) if the temperature is set excessively low, the temperature is preferably set in a range of 100 to 300° C. and is preferably set as low as approximately 100° C. from the viewpoint of convenience of the process. If the temperature is raised to 300° C. or more, C is diffused at high sped and is diffused to the substrate side before filling C defects.

As described above, the amount of C defects of the SiC region 121 subjected to the ion-implantation process becomes $10^{17}$ cm$^{-3}$ or more. At this time, the mobility is set to approximately 20 cm$^2$/Vs. The large amount of C defects can be reduced to $10^{13}$ cm$^{-3}$ or less by use of the process of this embodiment. At this time, the interface charge surface density is set to the order of $10^{10}$ cm$^2$ or less and reaches a level at which the roughness of the interface mainly causes deterioration in the mobility.

According to the deep-level transient spectroscopy (DLTS) measurement, the amount of C defects becomes approximately $10^{13}$ cm$^3$ and the mobility becomes approximately 350 cm$^2$/Vs. The mobility is equivalent to that of an Si/SiO$_2$ interface and it can be said that a sufficiently good interface can be formed.

If a channel is formed by epitaxial growth and the other process is performed in the same manner, the amount of C defects becomes approximately $10^{16}$ cm$^{-3}$ and the mobility becomes approximately 90 cm$^2$/Vs. It is understood that a large amount of C defects occur because the process such as the oxide film formation process is performed. The mobility is set low for the cost and this problem cannot be solved only by performing the epitaxial growth process. In this case, if C ions are implanted to compensate for C defects, the result sufficiently coincides with the above case and the amount of C defects becomes approximately $10^{13}$ cm$^{-3}$ and the mobility becomes approximately 350 cm$^2$/Vs.

Next, a resist film (not shown) having a pattern is formed on the oxide film 130 by use of a photolithography process. Portions of the oxide film 130 that lie on the surfaces of the SiC regions 123 and portions of the surfaces of the SiC regions 122 are removed by etching with the resist film used as a mask. As a result, the oxide film 130 that extends over the SiC regions 122 on both sides can be formed.

Subsequently, as the source electrode formation step (S9), conductive films formed of metal or the like are formed on the surfaces of the SiC regions 123 and portions of the surfaces of the SiC regions 122 that are exposed by removing the resist film and oxide film 130 and forming opening portions. The conductive films are used as source electrodes 150. After this, the conductive films left behind on the resist film are removed (lift off) by removing the resist film. Further, spaces can be formed to prevent the oxide film 130 and source electrodes 150 from contacting each other by narrowing the width of the oxide film 130 by etching back or the like. At this time, as the conductive film for forming the source electrode 150, for example, nickel (Ni) is preferably used.

[Source Electrode Formation at Low Temperature]

As the annealing step (S10), the heat treatment of 800° C. is performed after the source electrodes 150 are formed. In this case, for example, the heating time is set to five minutes in argon (Ar) gas. By the above heat treatment, Ni$_2$Si electrodes 150 are formed. Since a large amount of N is introduced in the SiC region 122, an electrode structure with low contact resistance is obtained. At the same time, since a large amount of Al is introduced in the SiC region 123, a contact of low contact resistance can easily be formed for the p-type contact.

In FIG. 5G, as the gate electrode formation step (S11), an electrode 140 used as a gate electrode is formed on the oxide film 130 used as a gate insulating film. For example, the electrode is formed of n-type polysilicon. Further, the source electrode may be formed of n-type polysilicon and salicide films of NiSi, Ni$_2$Si or the like may be used as electrodes by forming Ni films on both of the source electrode and gate electrode and subjecting the same to the heat treatment.

[Back Electrode]

Next, as the drain electrode formation step (S12), the structure shown in FIG. 3 is obtained by forming an electrode 160 used as a drain electrode on the back surface of the SiC substrate 100. In this case, for example, a Ni/Ti stack electrode is used for the back electrode. At this time, the heat treatment of approximately 800° C. is required. For example, the heating time is set to five minutes in argon (Ar) gas. By the above heat treatment, Ni$_2$Si is formed on the interface to make an ohmic connection.

As the SiC substrate 100, for example, a 4H—SiC substrate having the other surface such as a (000-1) plane as a main surface may be used. Alternatively, a (11-20) plane of a trench type MOSFET, that is, A plane can also be used. That is, if C defects near the interface are removed by introducing C into the SiO$_2$/SiC interface and performing an annealing process at a low temperature, an interface with the mobility higher than that of the conventional case can be obtained. A method for filling the C defects of the MOS interface by implanting C in this embodiment is effective irrespective of the substrate azimuth.

Thus, according to this embodiment, the C defects in the interface can be markedly reduced by introducing C into a portion near the interface between the 4H—SiC region 121 and the gate insulating film 130 after the gate insulating film 130 is formed on the p-type 4H—SiC region 121 and diffusing C introduced after formation of the gate insulating film 130. Therefore, the mobility of the 4H—SiC/SiO$_2$ insulating film interface can be increased. That is, the 4H—SiC/SiO$_2$ insulating film interface of the high mobility can be realized and the element characteristic of the DiMOSFET can be enhanced.

Second Embodiment

FIG. 6 is a cross-sectional view showing the element structure of an SiC semiconductor device according to a second embodiment and particularly shows a case where the embodiment is applied to an insulated gate bipolar transistor (IGBT). The same symbols are attached to the same portions as those of FIG. 3 and the detailed explanation thereof is omitted.

This embodiment is different from the first embodiment described before in that a p$^+$-type 4H—SiC substrate 200 is used instead of the n+-type 4H—SiC substrate 100 and a stack structure of an n+-type 4H—SiC layer 201 and n−-type 4H—SiC layer 202 is used instead of the n−-type SiC layer 102. In other words, the high-concentration n+-type SiC layer 201 is formed on the surface of the high-concentration p+-type SiC substrate 200 and then the low-concentration n−-type SiC layer 202 is formed on the structure. The SiC layers 201, 202 are used as withstand voltage holding layers.

Subsequently, SiC regions 121, 122, 123 and defect reduction layers 124 that are the same as those of the first embodiment are formed on the SiC layer 202 and electrodes 140, 250, 260 are further formed.

[Back Contact of IGBT]

The electrode 260 of a conductive material is formed on the back of the SiC substrate 200. The electrode 260 is used as a collector electrode (second conduction electrode). In this embodiment, a Ti/Al stack film is used. For example, an ohmic connection can be obtained by performing an annealing process for two minutes at 800° C. in Ar.

Further, the electrode 250 on the SiC region 123 is used as an emitter electrode (first conduction electrode) in this embodiment. As described before, the electrode 250 is formed in ohmic contact with the SiC region 122 and SiC region 123.

The manufacturing method is substantially the same as that of the first embodiment except that the SiC layers 201, 202 are formed on the SiC substrate 200 and the process of doping C into the channel region to reduce defects is the same as before.

With the above structure, the C defects on the interface can be markedly reduced by introducing C into a portion near the interface between the 4H—SiC region 121 and the gate insulating film 130 after the gate insulating film 130 is formed on the p-type 4H—SiC region 121 and diffusing C introduced after formation of the gate insulating film 130. Also, in this embodiment, a channel in which the amount of C defects is suppressed to a small value ($10^{13}$ cm$^{-2}$ or less) can be formed, the mobility is sufficiently high over a whole voltage application region and the peak is approximately 350 cm$^2$/Vs. In this respect, this embodiment is the same as the first embodiment.

Thus, in this embodiment, a 4H—SiC/SiO$_2$ insulating film interface of high mobility can be realized and a high-performance IGBT can be obtained. In this case, the bipolar operation is performed, the conduction modulation occurs and the on-resistance becomes small. As a result, the conduction ability can be markedly enhanced in comparison with the DiMOSFET of the first embodiment.

(Modification)

This invention is not limited to the above embodiments described above.

In the embodiments, an example in which this invention is applied to the DiMOSFET or IGBT is explained, but this invention can be applied to a structure having a p-type 4H—SiC region formed on the surface portion of an SiC substrate and a gate electrode formed on the 4H—SiC region with a gate insulating film disposed therebetween.

For example, this invention can be applied to a trench type vertical MOSFET as shown in FIG. 7 and FIG. 8. The device is formed by sequentially forming a first SiC region 121 of a p− type and a second SiC region 122 of an n+ type on a 4H—SiC layer 102 by epitaxial growth and then forming third SiC regions 123 of a p+ type by implanting. Next, portions of the second SiC region 122 are dug to form grooves and expose the side surfaces of the first SiC region 121. Then, after a gate insulating films 130 is formed on the side surface of each groove, a gate electrode 140 is filled in each groove to form the device. In this case, a defect reduction layer can be formed as a channel region 124 by introducing C into the side surface of the first SiC region 121 by oblique implanting after the gate insulating film 130 is formed and diffusing introduced C at low temperatures after formation of the gate insulating film 130.

Further, no problem occurs if the amount of carbon defects is set to $10^{15}$ cm$^{-3}$ or less in a range of 3 nm or less on the 4H—SiC side of the 4H—SiC/SiO$_2$ interface with respect to C defect density Cdef in the defect reduction layer. At this time, a mobility of 150 cm$^2$/Vs or more can be obtained. Further, as C defect density Cdef is reduced to $10^{14}$ cm$^{-3}$ or less, $10^{13}$ cm$^{-3}$ or less, the mobility is sequentially enhanced to 200 cm$^2$/Vs or more, 350 cm$^2$/Vs or more.

In the embodiment, C is introduced after the gate insulating film is formed on the first SiC region, but C may be introduced into the surface portion of the first SiC region immediately before formation of the gate insulating film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An SiC semiconductor device comprising:
   a p-type 4H—SiC region formed on a first part of a surface portion of an SiC substrate,
   a defect reduction layer formed in a surface portion of the p-type 4H—SiC region, the defect reduction layer having C defect density that is defined by Cdef={[Si density]+[p-type dopant density]−[C density]} and is set to Cdef<$10^{15}$ cm$^{-3}$ by introduction of carbon, a thickness of the defect reduction layer being equal to or less than 5 nm,
   a gate insulating film formed on the defect reduction layer, and
   a gate electrode formed on the gate insulating film,
   wherein the defect reduction layer and a second part of the surface portion of the SiC substrate are both in direct physical contact with the gate insulating film, the second part of the surface portion of the SiC substrate being different from the first part of the surface portion of the SiC substrate, and
   wherein the defect reduction layer comprises a channel of an n-type metal oxide semiconductor field effect transistor (MOSFET) which includes the gate insulating film and the gate electrode.

2. The device of claim 1, wherein an electron mobility of the field effect transistor having the defect reduction layer as the channel is not less than 150 cm$^2$/Vs.

3. The device of claim 1, wherein the C defect density (Cdef) of the defect reduction layer is set to Cdef<$10^{14}$ cm$^{-3}$.

4. The device of claim 3, wherein an electron mobility of the field effect transistor having the defect reduction layer as the channel is not less than 200 cm$^2$/Vs.

5. The device of claim 1, wherein the C defect density (Cdef) of the defect reduction layer is set to Cdef<$10^{13}$ cm$^{-3}$.

6. The device of claim 5, wherein an electron mobility of the field effect transistor having the defect reduction layer as the channel is not less than 350 cm$^2$/Vs.

7. The device of claim 1, wherein the defect reduction layer is formed by introducing the carbon between the p-type 4H—SiC region and the gate insulating film immediately before or after the gate insulating film is formed and diffusing the carbon after formation of the gate insulating film and introduction of the carbon.

8. The device of claim 7, wherein the defect reduction layer is formed by ion-implanting carbon ions in a range of ±5 nm of an interface to set a peak value to not less than $2\times10^{16}$ cm$^{-3}$.

9. The device of claim 1, wherein the SiC substrate is formed of n-type 4H—SiC.

10. The device of claim 1, wherein the SiC substrate is a stack structure of a p-type 4H—SiC layer and an n-type 4H—SiC layer disposed on the p-type 4H—SiC layer.

11. An SiC semiconductor device comprising:
- a first 4H—SiC region of a p type formed on a first part of a surface portion of an SiC substrate,
- a second 4H—SiC region of an n type formed in a first part of a surface portion of the first 4H—SiC region and formed separately from an end portion of the first 4H—SiC region,
- a third 4H—SiC region of the p type formed in a second part of the surface portion of the first 4H—SiC region, formed on an opposite side of the end portion with respect to the second 4H—SiC region and having an impurity concentration higher than that of the first 4H—SiC region,
- a defect reduction layer formed in a third part of the surface portion of the first 4H—SiC region and formed on the end portion side of the first 4H—SiC region with respect to the second 4H—SiC region, the defect reduction layer having C defect density that is defined by Cdef={[Si density]+[p-type dopant density]−[C density]} and is set to Cdef<$10^{15}$ cm$^{-3}$ by introduction of carbon, a thickness of the defect reduction layer being equal to or less than 5 nm,
- a gate insulating film formed on the defect reduction layer,
- a gate electrode formed on the gate insulating film,
- a first conduction electrode formed to extend over the second 4H—SiC region and the third 4H—SiC region, and
- a second conduction electrode formed on a back of the SiC substrate,
- wherein the defect reduction layer and a second part of the surface portion of the SiC substrate are both in direct physical contact with the gate insulating film, the second part of the surface portion of the SiC substrate being different from the first part of the surface portion of the SiC substrate, and
- wherein the defect reduction layer comprises a channel of an n-type metal oxide semiconductor field effect transistor (MOSFET) which includes the gate insulating film and the gate electrode.

12. The device of claim 11, wherein the SiC substrate is formed of n-type 4H—SiC.

13. The device of claim 11, wherein the SiC substrate is a stack structure of a p-type 4H—SiC layer and an n-type 4H—SiC layer disposed on the p-type 4H—SiC layer.

14. The device of claim 1, wherein the p-type dopant of the defect reduction layer is aluminum (Al).

15. The device of claim 1, wherein the defect reduction layer is a p-type inversion layer.

16. The device of claim 11, wherein the p-type dopant of the defect reduction layer is aluminum (Al).

17. The device of claim 11, wherein the defect reduction layer is a p-type inversion layer.

* * * * *